United States Patent
Yang et al.

(10) Patent No.: US 11,487,370 B2
(45) Date of Patent: Nov. 1, 2022

(54) TOUCH SUBSTRATE, TOUCH SUBSTRATE DRIVING METHOD AND PREPARATION METHOD, AND TOUCH DEVICE

(71) Applicant: BOE TECHNOLOGY GROUP CO., LTD., Beijing (CN)

(72) Inventors: Shengji Yang, Beijing (CN); Xue Dong, Beijing (CN); Xiaochuan Chen, Beijing (CN); Hui Wang, Beijing (IN); Pengcheng Lu, Beijing (IN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 3 days.

(21) Appl. No.: 16/444,332

(22) Filed: Jun. 18, 2019

(65) Prior Publication Data
US 2020/0012371 A1 Jan. 9, 2020

(30) Foreign Application Priority Data
Jul. 3, 2018 (CN) .......................... 201810719896.7

(51) Int. Cl.
*G06F 3/041* (2006.01)
*G06F 3/044* (2006.01)
*H01L 27/32* (2006.01)

(52) U.S. Cl.
CPC ............ *G06F 3/0412* (2013.01); *G06F 3/044* (2013.01); *G06F 3/0416* (2013.01);
(Continued)

(58) Field of Classification Search
CPC ............... H01L 27/323; H01L 51/5221; H01L 27/3246; G06F 3/0443; G06F 3/0412;
(Continued)

(56) References Cited

U.S. PATENT DOCUMENTS 10,296,133 B2  5/2019 Meng
2011/0260167 A1*  10/2011 Hosokawa .......... H01L 27/3276
257/59
(Continued)

FOREIGN PATENT DOCUMENTS

CN  103677453 A  3/2014
CN  104978071 A  10/2015
(Continued)

OTHER PUBLICATIONS

Kim et al., "Low-Power Touch-Sensing Circuit With Reduced Scanning Algorithm for Touch Screen Panels on Mobile Devices", Journal of Display Technology, vol. 11, No. 1, Jan. 2015, pp. 36-43 (8 pages).

(Continued)

*Primary Examiner* — Yaron Cohen
(74) *Attorney, Agent, or Firm* — Collard & Roe, P.C.

(57) ABSTRACT

A touch substrate, a driving method of a touch substrate, a preparation method of a touch substrate, and a touch device are disclosed. The touch substrate includes an underlying substrate and a touch layer, and the touch layer is on the underlying substrate. The touch layer includes a plurality of touch electrodes which are electrically separated from each other, each of the touch electrodes overlaps with an edge area of the touch substrate in a direction perpendicular to the underlying substrate, and each of the touch electrodes is electrically connected with a touch signal line on the underlying substrate in the edge area. The touch substrate can improve the pixel aperture ratio of the display area, so that the touch device including the touch substrate can achieve better display effect.

14 Claims, 5 Drawing Sheets

(52) U.S. Cl.
CPC ........ *H01L 27/323* (2013.01); *H01L 27/3246* (2013.01); *G06F 2203/04103* (2013.01)

(58) Field of Classification Search
CPC ...... G06F 3/0416; G06F 3/044; G06F 3/0446; G06F 2203/04103
See application file for complete search history.

(56) References Cited

U.S. PATENT DOCUMENTS

| | | |
|---|---|---|
| 2016/0209956 A1 | 7/2016 | Besshi |
| 2016/0239130 A1* | 8/2016 | Chen .................... G06F 3/0412 |
| 2017/0357361 A1* | 12/2017 | Hong .................... B60W 10/18 |

FOREIGN PATENT DOCUMENTS

| | | |
|---|---|---|
| CN | 105930012 A | 9/2016 |
| CN | 206236055 U | 6/2017 |
| CN | 107247921 A | 10/2017 |
| JP | 2014-095968 A | 5/2014 |

OTHER PUBLICATIONS

Chinese Office Action in Chinese Application No. 201810719896.7, dated Jan. 6, 2021 with English translation.

* cited by examiner

TOUCH SUBSTRATE, TOUCH SUBSTRATE DRIVING METHOD AND PREPARATION METHOD, AND TOUCH DEVICE

CROSS-REFERENCE TO RELATED APPLICATIONS

The application claims priority to Chinese patent application No. 201810719896.7, filed on Jul. 3, 2018, the entire disclosure of which is incorporated herein by reference as part of the present application.

TECHNICAL FIELD

Embodiments of the present disclosure relate to a touch substrate, a driving method of a touch substrate, a preparation method of a touch substrate, a touch device and a touch electrode structure.

BACKGROUND

At present, the mainstream touch technology in the market is an out-cell touch mode. However, the out-cell touch mode is not a better touch solution in terms of thickness or cost. Some manufacturers prepare the touch sensor on the thin film encapsulation (TFE) layer of OLED products, but the process of this structure is complex and difficult.

Compared with out-cell touch technology, in-cell touch technology is more and more popular with display panel manufacturers due to its compatibility with display panel process. Many companies have also listed the development of in-cell touch technology as the main direction of technology research.

SUMMARY

At least an embodiment of the present disclosure provides a touch substrate, including an underlying substrate and a touch layer. The touch layer is on the underlying substrate. The touch layer includes a plurality of touch electrodes which are electrically separated from each other, each of the touch electrodes overlaps with an edge area of the touch substrate in a direction perpendicular to the underlying substrate, and each of the touch electrodes is electrically connected with a touch signal line on the underlying substrate in the edge area.

For example, in the touch substrate provided by an embodiment of the present disclosure, at least an edge of each of the touch electrodes is located in the edge area of the touch substrate.

For example, in the touch substrate provided by an embodiment of the present disclosure, each of the touch electrodes is connected to the touch signal line on the underlying substrate through a via hole provided in the edge area.

For example, in the touch substrate provided by an embodiment of the present disclosure, the plurality of touch electrodes are separated according to connecting lines between a preset reference point on the touch layer and the edge area.

For example, in the touch substrate provided by an embodiment of the present disclosure, the preset reference point is located at center of the touch layer.

For example, in the touch substrate provided by an embodiment of the present disclosure, the plurality of touch electrodes are separated according to connecting lines between the edge area and a plurality of preset reference points on the touch layer.

For example, in the touch substrate provided by an embodiment of the present disclosure, the plurality of touch electrodes are identical in size.

For example, in the touch substrate provided by an embodiment of the present disclosure, a maximum width of each of the touch electrodes is less than or equal to an average finger width.

For example, in the touch substrate provided by an embodiment of the present disclosure, a material of the touch layer includes a metal with a low work function or a metal alloy with a low work function.

For example, in the touch substrate provided by an embodiment of the present disclosure, a material of the touch layer is magnesium or silver.

For example, the touch substrate provided by an embodiment of the present disclosure further includes a first electrode layer, a pixel definition layer, and an organic light-emitting layer. The first electrode layer and the pixel definition layer comprise patterns on the underlying substrate; the organic light-emitting layer is arranged on a side, away from the underlying substrate, of the first electrode layer and the pixel definition layer; and the touch layer is arranged on a side, away from the underlying substrate, of the organic light-emitting layer.

For example, in the touch substrate provided by an embodiment of the present disclosure, the touch layer is further configured to be a second electrode layer corresponding to the first electrode layer.

For example, in the touch substrate provided by an embodiment of the present disclosure, the first electrode layer is an anode layer, and the second electrode layer is a cathode layer.

For example, the touch substrate provided by an embodiment of the present disclosure further includes a plurality of spacers. The plurality of spacers are disposed between the pixel definition layer and the organic light-emitting layer, orthographic projections of the plurality of spacers on the underlying substrate overlap with orthographic projections of gaps between the plurality of touch electrodes on the underlying substrate, and the plurality of touch electrodes are separated by the plurality of spacers.

For example, in the touch substrate provided by an embodiment of the present disclosure, a cross section of each of the spacers in a direction perpendicular to an extending direction of each of the gaps between the touch electrodes is an inverted trapezoid.

At least an embodiment of the present disclosure further provides a touch device, including the touch substrate provided by any embodiment of the present disclosure.

At least an embodiment of the present disclosure further provides a driving method of a touch substrate, including: inputting a touch signal to a touch layer of the touch substrate in a touch phase, and inputting a display signal to the touch layer in a display phase. The touch layer is on an underlying substrate of the touch substrate, the touch layer includes a plurality of touch electrodes which are electrically separated from each other, each of the touch electrodes overlaps with an edge area of the touch substrate in a direction perpendicular to the underlying substrate, and each of the touch electrodes is electrically connected with a touch signal line on the underlying substrate in the edge area to receive the touch signal.

At least an embodiment of the present disclosure further provides a preparation method of a touch substrate, including: providing an underlying substrate, forming a touch signal line on the underlying substrate in an edge area, and forming a touch layer on the underlying substrate. The touch layer includes a plurality of touch electrodes which are electrically separated from each other, each of the touch electrodes overlaps with an edge area of the touch substrate in a direction perpendicular to the underlying substrate, and each of the touch electrodes is electrically connected with the touch signal line on the underlying substrate in the edge area.

At least an embodiment of the present disclosure further provides a touch electrode structure, including a plurality of touch electrodes which are electrically separated from each other. The plurality of touch electrodes are arranged around a preset reference point, and each of the touch electrodes is configured to receive a touch signal at an edge portion away from the preset reference point.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
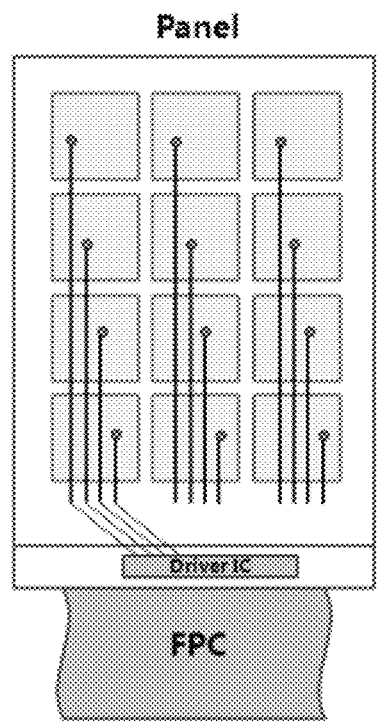
FIG. 1 is a schematic diagram of a planar structure of a touch panel.

The in-cell touch technology is mainly to divide the touch layer of the touch device into a plurality of square touch sensing blocks, that is, a plurality of touch sensors. FIG. 1 is a schematic diagram of a planar structure of a touch panel. As shown in FIG. 1, the touch panel includes a plurality of touch sensors, and each of the touch sensors is respectively connected with a metal wire through a via hole and is further connected to a driver IC of a flexible printed circuit (FPC) through the metal wire to receive the touch signal. However, due to the arrangement of a plurality of via holes and a plurality of metal wires, the pixel aperture ratio of the display area of the touch panel is seriously reduced, thereby affecting the display effect of the touch panel.

Therefore, although the touch panel with in-cell touch technology as shown in FIG. 1 can increase the touch sensitivity, due to the arrangement of the plurality of via holes and the plurality of metal wires, on one aspect, the pixel aperture ratio of the display area is seriously affected. For example, under the same pixels per inch (PPI) and the same process conditions, the pixel aperture ratio of the display area of the touch panel as shown in FIG. 1 is decreased by about 33%, thus reducing the service life of the touch panel (for example, an OLED touch panel). On the other aspect, because the preparation of via holes requires the use of the fine metal mask (FMM) between layers of the touch panel, the excessive use of the FMM will not only lead to an increase in the materials, but also will reduce the preparation yield of the touch panel.

At least an embodiment of the present disclosure provides a touch substrate, a driving method of a touch substrate, a preparation method of a touch substrate, a touch device and a touch electrode structure. The touch substrate can improve the pixel aperture ratio of the display area, and further improve the display effect of the touch device comprising the touch substrate.

Hereinafter, embodiments of the present disclosure will be described in detail with reference to the accompanying drawings. It should be noted that the same reference symbol in different drawings will be used to refer to the same described component.

At least an embodiment of the present disclosure provides a touch substrate, including an underlying substrate and a touch layer. The touch layer is located on the underlying substrate, the touch layer includes a plurality of touch electrodes which are electrically separated from each other (i.e., insulated from each other), each of the touch electrodes overlaps with an edge area of the touch substrate in a direction perpendicular to the underlying substrate, and each of the touch electrodes is electrically connected with a touch signal line on the underlying substrate in the edge area.

Figure 2:
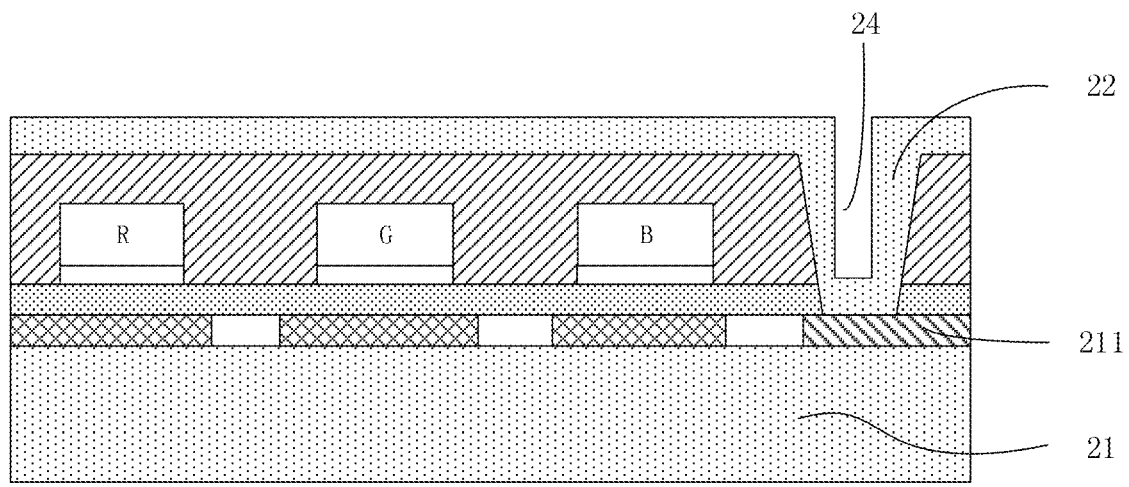
FIG. 2 is a schematic cross-sectional structural diagram of a touch substrate provided by at least an embodiment of the present disclosure.
Figure 3:
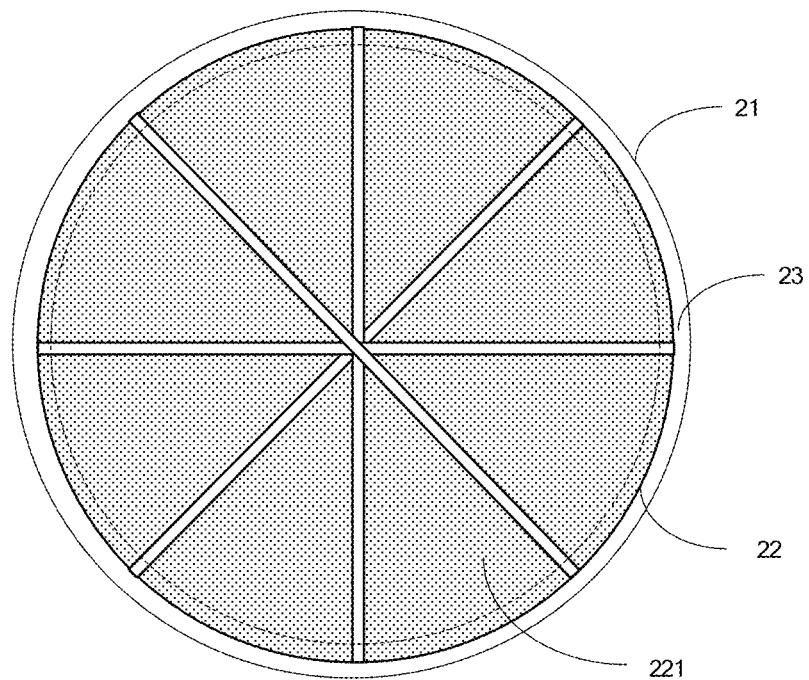
FIG. 3 is a schematic diagram of a planar structure of a touch substrate provided by at least an embodiment of the present disclosure.

FIG. 2 is a schematic cross-sectional structural diagram of a touch substrate provided by at least an embodiment of the present disclosure, and FIG. 3 is a schematic diagram of a planar structure of a touch substrate provided by at least an embodiment of the present disclosure. For example, as shown in FIG. 2 and FIG. 3, the touch substrate may include an underlying substrate 21 and a touch layer 22 on the underlying substrate 21. The touch layer 22 includes a plurality of touch electrodes 221 which are electrically separated from each other, and the plurality of touch electrodes 221 are insulated from each other.

For example, as shown in FIG. 3, each of the touch electrodes 221 overlaps with an edge area 23 of the touch substrate in a direction perpendicular to the underlying substrate 21, and for example, at least an edge of each of the touch electrodes 221 is located in the edge area 23 of the touch substrate.

It should be noted that in the embodiments of the present disclosure, at least a portion of each of the touch electrodes 221 is located in the edge area 23 of the touch substrate, and the embodiments of the present disclosure do not limit the size of the portion, that is, the embodiments of the present disclosure do not limit the size of the overlapping portion between the touch electrode 221 and the edge area 23.

For example, each of the touch electrodes 221 is electrically connected with a touch signal line 211 on the underlying substrate 21 in the edge area 23. For example, combined with FIG. 2 and FIG. 3, in some embodiments of the present disclosure, each of the touch electrodes 221 may be connected to the touch signal line 211 on the underlying substrate 21 through a via hole 24 provided in the edge area 23. Because the via hole 24 is disposed in the edge area 23 of the touch substrate, and for example, the edge area 23 may be a frame area, i.e., a non-display area, of the touch device including the touch substrate, the via hole 24 does not occupy the display area of the touch substrate, so that the aperture ratio of each pixel (e.g., pixels R, G, B shown in FIG. 2) in the display area will not be affected, and the display luminance uniformity of the touch device including the touch substrate is significantly improved, thereby allowing the touch device to achieve a better display effect.

In addition, because the via hole for allowing the touch electrode and the touch signal line to be connected is arranged in the edge area of the touch substrate, the number of fine metal masks (FMM) does not need to be additionally increased in the process of manufacturing the touch substrate, thereby saving the production cost of the touch substrate process and improving the preparation yield.

Figure 6:
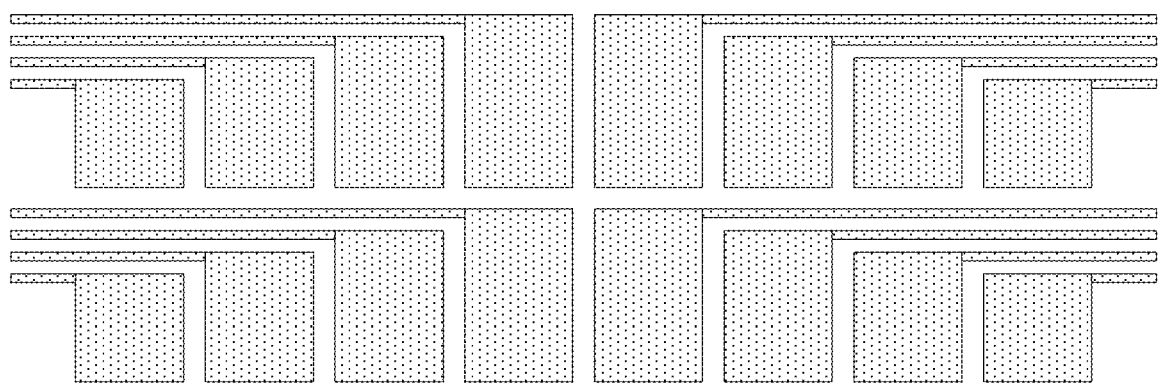
FIG. 6 is a schematic diagram of a planar structure of a touch substrate.

Moreover, compared with a schematic diagram of a planar structure of a touch substrate shown in FIG. 6, because in the touch substrate shown in FIG. 2 and FIG. 3, each touch electrode is electrically connected to the touch signal line (for example, through the via hole) in the edge area of the touch substrate, the connection does not need to occupy the display area, and the voltage drop is small in the signal transmission process. Therefore, compared with the wire arranging method of the touch substrate shown in FIG. 6, the method of connection in the edge area shown in FIG. 2 and FIG. 3 has no problems of touch blind area (e.g., wire area) or internal resistance drop (IR-Drop), thus ensuring the touch uniformity and sensitivity of the touch device including the touch substrate to the maximum extent.

It should be noted that in the embodiments shown in FIG. 2, only three pixels R, G, B are shown, but the embodiments of the present disclosure are not limited to this. According to different practical application requirements, the touch electrodes 221 may cover one or more pixels, and the embodiments of the present disclosure are not limited to this.

For example, in some other embodiments of the present disclosure, each touch electrode 221 may be electrically connected to the touch signal line 211 on the underlying substrate 21 through a wire disposed outside the touch substrate. The embodiments of the present disclosure do not limit the electrical connection manner between the touch electrode 221 and the touch signal line 211. For example, the electrical connection between the touch electrodes 221 and the touch signal lines 211 may be the same, or may be different from each other.

For example, the touch electrode 221 may receive a touch signal through the touch signal line 211, and may also provide the obtained touch information to, for example, a control circuit through the touch signal line 211, thereby allowing the touch device including the touch substrate to determine the corresponding touch position according to the touch information received.

For example, the touch electrode 221 can be electrically connected to a driver IC of a flexible printed circuit (FPC) through the touch signal line 211 to transmit signals. For example, the driver IC can provide the touch signal to the touch electrode 221 through the touch signal line 211 to drive the touch electrode 221 to perform a touch operation. For example, the driver IC can also analyze and process the touch information obtained by the touch electrode 221 to determine the corresponding touch position (e.g., to obtain the coordinates corresponding to the touch position), and can provide the processed touch information to, for example, a master control chip, thereby allowing the touch device including the touch substrate to realize the corresponding touch operation.

For example, the touch electrode 221 can receive the touch signal through the touch signal line 211 to perform the touch operation, or in some embodiments of the present disclosure, the touch signal line 211 may also provide other functional signals to the touch electrode 221 to enable the touch electrode 221 to cooperate with the touch device including the touch substrate to perform other operations, such as a display operation, etc.

The touch substrate provided by the embodiments of the present disclosure can be applied to touch products with small sizes, such as wearable devices, and can also be applied to touch products with large sizes, such as display screens.

For example, in some embodiments of the present disclosure, because the touch electrode and the touch signal line are connected through the via hole arranged in the edge area of the touch substrate, and for example, the edge area may be a frame area, i.e., a non-display area, of the touch device including the touch substrate, the via hole does not occupy the display area of the touch device, and for example, does not affect the pixel aperture ratio in the display area of the touch device, thereby improving the uniformity of the display luminance of the touch device including the touch substrate and improving the display effect.

In addition, the method of allowing the touch electrode and the touch signal line to be connected in the peripheral area (i.e. the edge area) of the touch substrate is feasible, and the preparation yield of the touch substrate can be remarkably improved. Moreover, under the condition of being applied to touch devices with the same signal-to-noise ratio and the same pixel pitch, the number of required touch channels of the touch substrate provided by the present embodiments is small, so that the IC size of the touch device can be greatly reduced, the IC preparation cost of the touch device can be reduced, and the touch device is easy to realize the design of a narrow frame.

In the touch substrate provided by some embodiments of the present disclosure, because the area where the touch electrode is electrically connected with the touch signal line is located in the edge area of the touch substrate, and for example, the via hole disposed is located in the edge area of the touch substrate, that is, in the frame area (i.e., the non-display area) of the touch device including the touch substrate, the electrical connection, such as the connection through the via hole, does not affect the pixel aperture ratio of the display area, thereby improving the pixel aperture ratio of the display area of the touch substrate, improving the uniformity of the display luminance of the touch device including the touch substrate, and further improving the display effect of the touch device.

It should be noted that in the embodiments shown in FIG. 3, the planar profile of the touch substrate is illustrated as a circle, but the embodiments of the present disclosure are not limited thereto. In other embodiments of the present disclosure, the planar profile of the touch substrate may also be square, oval or other irregular shapes, and the embodiments of the present disclosure are not limited to this.

The division method of the touch electrodes in the touch layer will be described in the following by taking the planar profile of the touch substrate as a circle as an example.

Figure 4:
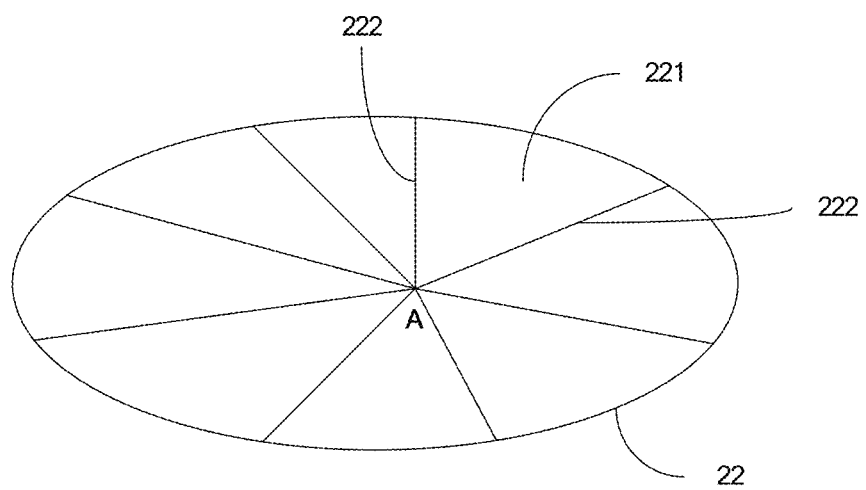
FIG. 4 is a schematic diagram of a planar structure of a touch layer provided by at least an embodiment of the present disclosure.

FIG. 4 is a schematic diagram of a planar structure of a touch layer provided by at least an embodiment of the present disclosure. For example, as shown in FIG. 3 and FIG. 4, in some embodiments of the present disclosure, the touch electrodes 221 may be separated according to connecting lines between a preset reference point A on the touch layer 22 and the edge area 23.

For example, as shown in FIG. 4, the touch electrodes 221 may be separated according to a plurality of connecting lines 222 between the preset reference point A on the touch layer 22 and any of the points on the edge of the touch layer 22, that is, each touch electrode 221 is surrounded by two connecting lines 222 and a part of the edge of the touch layer 22. For example, the connecting line 222 corresponds to a gap position between the touch electrodes 221 shown in FIG. 3.

For example, in some embodiments of the present disclosure, in order to improve the display luminance uniformity and touch uniformity of the touch device including the touch substrate, the preset reference point A may be located at the center of the touch layer 22, so that the touch electrodes 221 are arranged around the preset reference point A to uniformly cover the touch substrate.

For example, in some embodiments of the present disclosure, according to practical requirements, such as according to different methods of dividing functional areas of the touch device including the touch substrate, the preset reference point A may be located at other positions of the touch layer 22, and for example, the preset reference point A may correspond to a center position of the preset touch area or other suitable positions in the touch device. The embodiments of the present disclosure are not limited to this.

For example, as shown in FIG. 3 and FIG. 4, in a case where the planar profile of the touch substrate is a circle, the touch layer 22 may be divided into a plurality of sector-shaped touch electrodes 221 by a plurality of connecting lines between the touch reference point A located at the center of the circle and any of the points on the edge of the touch layer 22. For example, the edge portion of the touch layer 22 is located in the edge area 23 of the touch substrate, that is, the edge portion of each touch electrode 221 of the touch layer 22 is located in the edge area 23 of the touch substrate, and for example, at least an edge of each touch electrode 221 is located in the edge area 23 of the touch substrate.

For example, in order to further improve the touch uniformity, the touch uniformity of the touch device including the touch substrate can be significantly improved by adjusting the positions of the connecting lines between the preset reference point A and the edge area 23, so that the sizes of the touch electrodes 221 are the same, and the touch electrodes 221 are further in a uniform distribution around the preset reference point A in the touch layer 22.

For example, in some embodiments of the present disclosure, the touch electrodes 221 may also be separated according to connecting lines between the edge area 23 and a plurality of preset reference points on the touch layer 22. For example, in order to avoid mutual influence between the touch electrodes 221 in the central portion of the touch layer 22, the touch electrodes 221 can be annularly separated around the central portion (e.g., a circular portion located in the center) of the touch layer 22, that is, the touch electrodes 221 do not cover the central portion of the touch layer 22, so that the touch electrodes 221 do not influence each other in the central portion of the touch layer 22, and the touch stability and sensitivity of the touch substrate are improved.

For example, in some embodiments of the present disclosure, the sizes of the touch electrodes 221 in the touch layer 22 may also be different from each other according to practical application requirements. For example, according to different manners of dividing the functional areas of the touch device including the touch substrate, some touch electrodes 221 may have a larger size and some touch electrodes 221 may have a smaller size. For example, in some embodiments of the present disclosure, the size and arrangement of each touch electrode 221 in the touch layer 22 can be adjusted correspondingly according to the practical shape or profile of the touch substrate to improve the touch sensitivity of the touch substrate. The embodiments of the present disclosure do not limit the size, shape or arrangement of each touch electrode 221 in the touch layer 22.

For example, in some embodiments of the present disclosure, a material of the touch layer 22 may include a metal with a low work function or a metal alloy with a low work function, such as magnesium-aluminum alloy (MgAl), lithium-aluminum alloy (LiAl), or magnesium metal, aluminum metal, lithium metal, etc.

For example, in order to enable the touch substrate in the above embodiments to be applied to, for example, flexible touch display products, the material of the touch layer 22 may be, for example, a metal such as magnesium (Mg), silver (Ag), or a metal alloy.

Figure 5:
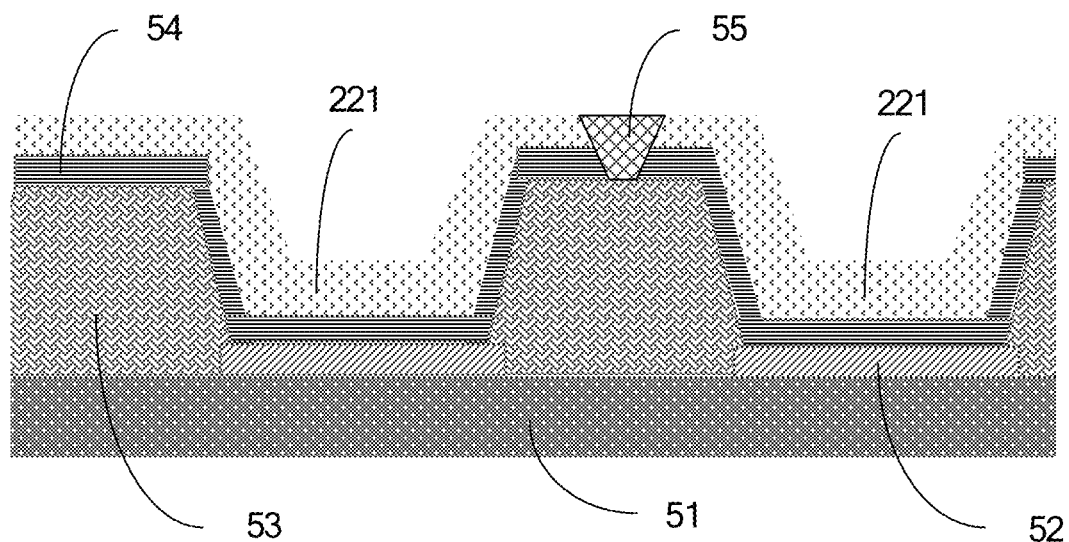
FIG. 5 is a schematic cross-sectional structural diagram of another touch substrate provided by at least an embodiment of the present disclosure.

FIG. 5 is a schematic cross-sectional structural diagram of another touch substrate provided by at least an embodiment of the present disclosure. For example, as shown in FIG. 5, the touch substrate includes an underlying substrate 51, a first electrode layer 52 (e.g., an anode layer) that is patterned (i.e., comprises a first pattern) on the underlying substrate 51, a pixel definition layer 53 that is patterned (i.e., comprises a second pattern) on the underlying substrate 51, and an organic light-emitting layer 54 formed on a side, away from the underlying substrate 51, of the anode layer 52 and the pixel definition layer 53. The touch layer 22 is formed on a side, away from the underlying substrate 51, of the organic light-emitting layer 54, and the touch layer 22 can be further configured to be, that is, can be further used as, a second electrode layer (such as a cathode layer) corresponding to the anode layer 52.

For example, in a touch phase of the touch device including the touch substrate, each touch electrode 221 in the touch layer 22 receives a touch signal to perform a touch operation; and in a display phase of the touch device, each touch electrode 221 in the touch layer 22 receives, for example, a display signal, and is further used as a cathode to cooperate with the anode in the anode layer 52 to perform a display operation.

It should be noted that in the present embodiments, the touch layer 22 is further used as the cathode layer, and cooperates with the anode layer 52 to perform image display. However, in some other embodiments of the present disclosure, the touch substrate may also be separately provided with a cathode layer corresponding to the anode layer 52, and the touch layer 22 is provided on a side, away from the underlying substrate 51, of the cathode layer. The embodiments of the present disclosure are not limited to this.

For example, the plurality of separate touch electrodes 221 on the touch layer 22 can be formed in various ways. For example, as shown in FIG. 5, the touch substrate may further include spacers 55, and the touch electrodes 221 may be separated by spacers 55 formed between the pixel definition layer 53 and the organic light-emitting layer 54.

For example, as shown in FIG. 5, in some embodiments of the present disclosure, spacers 55 are used to separate each of the touch electrodes 221. The orthographic projection of the spacer 55 on the underlying substrate 51 overlaps with the orthographic projection of the gap between the touch electrodes 221 on the underlying substrate 51. Of course, the plurality of separate touch electrodes 221 may also be formed by a patterning process or the like, and the embodiments of the present disclosure are not limited to this.

For example, as shown in FIG. 5, the cross section of the spacer 55 in a direction perpendicular to the extending direction of the gap between the touch electrodes 221 may be an inverted trapezoid or other shapes. For example, in practical applications, the spacer 55 may use, for example, a negative photoresist to form a retaining wall, and in the subsequent process of, for example, evaporation of the touch layer 22 or cathode layer, the spacer 55 may be disconnected at the corresponding position to form a gap, thereby obtaining the touch electrodes 221 which are electrically separated from each other.

For example, the underlying substrate 51 may be a transparent glass substrate or a transparent plastic substrate.

For example, in the case where the touch layer 22 is further used as the cathode layer, in order to effectively inject electrons or holes into the organic light-emitting layer 54, the injected energy barrier needs to be lowered. Therefore, the touch layer 22 can be a metal with a low work function, and the anode layer 52 can be a transparent material with a high work function. For example, materials which can form the anode layer 52 include indium tin oxide (ITO), indium zinc oxide (IZO), indium gallium oxide (IGO), gallium zinc oxide (GZO), zinc oxide (ZnO), indium oxide (In2O3), aluminum zinc oxide (AZO), carbon nanotubes, and the like; and the cathode layer, that is, the touch layer 22, is formed of a material including magnesium-aluminum alloy (MgAl), lithium-aluminum alloy (LiAl), magnesium, aluminum, lithium, or the like.

For example, the anode layer 52 may be formed by chemical vapor deposition, and the cathode layer (e.g., the touch layer 22) may be formed by sputtering or the like.

For example, the pixel definition layer 53 is generally formed by an organic insulating material (e.g., acrylic resin) or an inorganic insulating material such as silicon nitride (SiNx) or silicon oxide (SiOx). For example, the pixel definition layer 53 may be formed by a physical vapor deposition method, a chemical vapor deposition method, or a coating method. For example, subsequent to forming the pixel definition layer 53, the anode layer 52 may be exposed by a photolithography pattern process.

For example, the material of the organic light-emitting layer 54 can be selected according to different colors of emitted light. The material of the organic light-emitting layer 54 includes a fluorescent light-emitting material or a phosphorescent light-emitting material. For example, a doping material can be mixed into the main light-emitting material to obtain usable light-emitting materials. For example, the main light-emitting material can be a metal compound material, an anthracene derivative, an aromatic diamine compound, a triphenylamine compound, an aromatic triamine compound, a biphenyldiamine derivative or a triarylamine polymer, etc. For example, the organic light-emitting layer 54 may be formed by an inkjet printing method.

For example, in some embodiments of the present disclosure, in order to enable the touch device including the touch substrate to accurately determine the touch position, the maximum width of each touch electrode in the touch layer may be less than or equal to the width of a finger, so that in the touch position detecting process, for example, only one touch point is required to determine the touch position.

Taking the circular touch substrate shown in FIG. 3 as an example, the method of determining the touch position using the touch substrate provided by some embodiments of the present disclosure will be described below.

Figure 7:
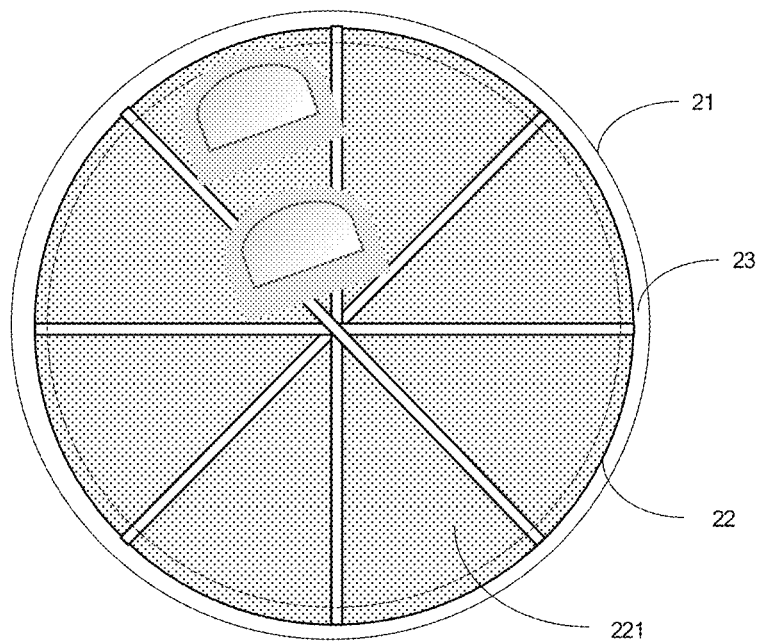
FIG. 7 is a schematic planar diagram of fingers touching at different positions on the same touch electrode provided by at least an embodiment of the present disclosure.
Figure 8:
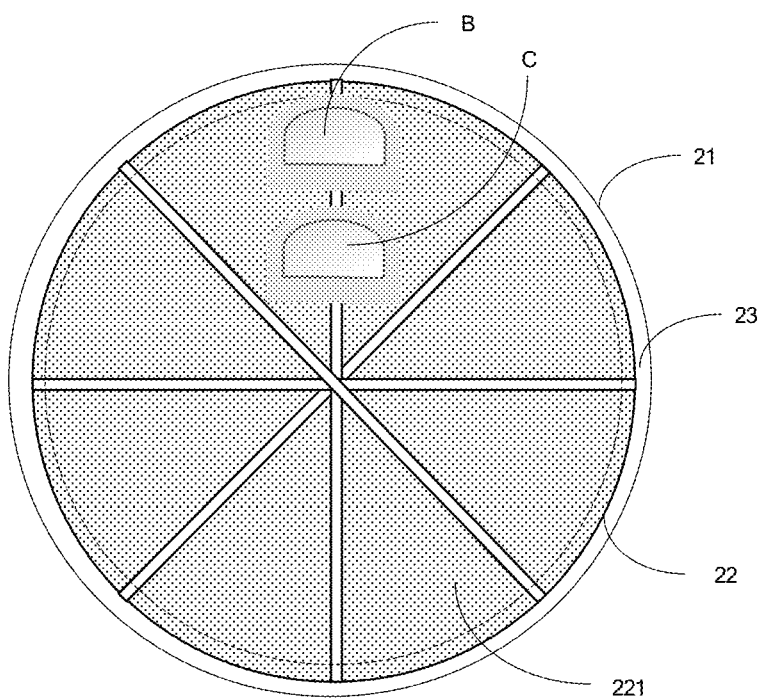
FIG. 8 is a schematic planar diagram of fingers touching at different positions on two touch electrodes provided by at least an embodiment of the present disclosure.

FIG. 7 is a schematic planar diagram of fingers touching at different positions on the same touch electrode provided by at least an embodiment of the present disclosure, and FIG. 8 is a schematic planar diagram of fingers touching at different positions on two touch electrodes provided by at least an embodiment of the present disclosure.

For example, as shown in FIG. 7, when a finger touches different positions within the same touch electrode 221, due to the difference in the facing areas between the finger and the touch electrode 221, the facing areas of the finger and the sector-shaped touch electrode 221 are linearly related to the center (e.g., the preset reference point A) of the circle, so the capacitance formed between the finger and the sector-shaped touch electrode 221 is also linear with respect to the center of the circle. For example, signals such as voltage or current on each touch electrode 221 electrically connected to the touch signal line provided on the underlying substrate 21 can be collected, and the touch position can be determined according to the linear relationship of the capacitance formed between the finger and the touch electrode 221. For example, the maximum width of the touch electrode 221 can be less than or equal to an average finger width (e.g., 1.5 cm) to reduce misjudgment of the touch position and further to improve the sensitivity and accuracy of determining the touch position.

In some embodiments of the present disclosure, in order to more accurately determine the touch position, detection can also be assisted in a manner of additional resistance loading between the touch position and the via hole position. For example, as shown in FIG. 8, in the touch substrate, the position B is closer to a conduction position, i.e., closer to the edge area 23 where the via hole is located, so the impedance is small. However, the position C is relatively far from the conduction position, i.e., far from the edge area 23 where the via hole is located, so that the impedance is large. Therefore, the touch position can be assisted to be determined according to the magnitude of the impedance, thereby improving the accuracy of determining the touch position.

At least an embodiment of the present disclosure also provides a touch device, and the touch device includes the touch substrate according to any embodiment of the present disclosure. The technical effect and implementation principle of the touch device are basically the same as those of the touch substrate described in the embodiments of the present disclosure, and will not be repeated here. For example, the touch device may be a touch display device, and for example, it may be any product or component with display function, such as a liquid crystal panel, an electronic paper, an OLED panel, a mobile phone, a tablet computer, a television, a display screen, a notebook computer, a digital photo frame, a navigator, etc. The embodiments of the present disclosure are not limited to this.

At least an embodiment of the present disclosure also provides a driving method of a touch substrate, including: inputting a touch signal to a touch layer of the touch substrate in a touch phase; and in a display phase, inputting a display signal to the touch layer. The touch layer is located on an underlying substrate of the touch substrate, the touch layer includes a plurality of touch electrodes which are electrically separated from each other, each of the touch electrodes overlaps with an edge area of the touch substrate in a direction perpendicular to the underlying substrate, and each of the touch electrodes is electrically connected with a touch signal line on the underlying substrate in the edge area to receive the touch signal.

Figure 9:
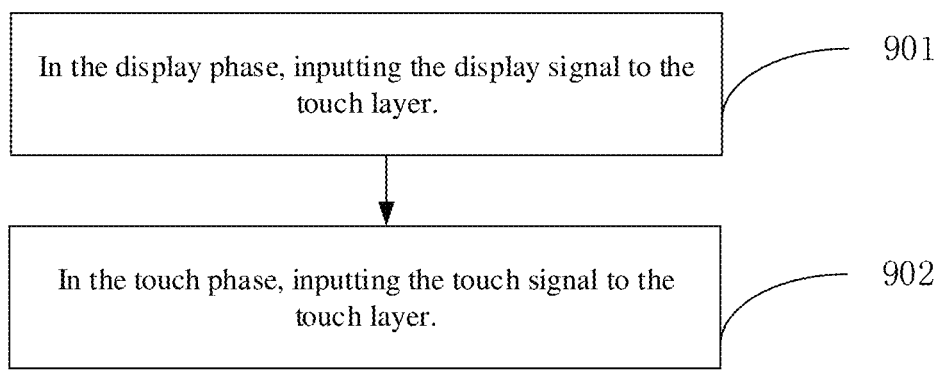
FIG. 9 is a flowchart of a driving method of a touch substrate provided by at least an embodiment of the present disclosure.

For example, the driving method can be used to drive the touch substrate described in any one of the above embodiments, and for example, taking the touch substrate shown in FIG. 5 as an example, as shown in FIG. 9, the driving method can include the following steps.

Step 901: In the display phase, inputting the display signal to the touch layer.

For example, the display signal may be applied to the touch layer within, for example, ¾ of a frame of display image of the touch device including the touch substrate, in a case where the touch layer is also used as a cathode layer. For example, a cathode direct current voltage signal can be applied to the touch layer to form an electric field or current between the touch layer and the anode layer, thereby causing the touch device to display an image.

Step 902: In the touch phase, inputting the touch signal to the touch layer.

For example, the touch signal can be applied to the touch layer within, for example, ¼ of a frame of display image of the touch device, and simultaneously, a synchronous drive can be performed on, for example, a metal layer on the touch substrate, i.e., synchronous alternating current signals are applied to the touch layer and the metal layer, so that the capacitance generated by the touch substrate in the case of no touch is zero. Simultaneously, the anode layer of the touch substrate needs to be black inserted, thereby minimizing the loading of the touch electrode to the ground and enabling the touch electrode to satisfy the requirements of self-capacitance touch. Compared with the mutual-capacitance touch method using a metal mesh multi-layer, the touch substrate of self-capacitance type provided by the present embodiments has a higher signal-to-noise ratio (SNR), and can more accurately detect and determine the touch position.

It should be noted that in one frame of the display image in the embodiments of the present disclosure, the sequence of the touch phase and the display phase is not limited. For example, in one frame of display image, each touch electrode can perform touch operation first and then perform display operation; or alternatively, in one frame of display image, each touch electrode can perform the display operation prior to the touch operation. For example, the embodiments of the present disclosure do not limit the specific lengths occupied by the touch phase and the display phase respectively in one frame of display image. For example, the touch operation may be performed in each frame of the display image of the touch device, or may be performed at intervals of, for example, 2 frames or more frames, and the embodiments of the present disclosure are not limited to this.

At least an embodiment of the present disclosure also provides a preparation method of a touch substrate, including: providing an underlying substrate, forming a touch signal line on the underlying substrate in an edge area, and forming a touch layer on the underlying substrate. The touch layer includes a plurality of touch electrodes which are electrically separated from each other, each of the touch electrodes overlaps with an edge area of the touch substrate in a direction perpendicular to the underlying substrate, and each of the touch electrodes is electrically connected with the touch signal line on the underlying substrate in the edge area.

At least an embodiment of the present disclosure also provides a touch electrode structure, including a plurality of touch electrodes which are electrically separated from each other. The plurality of touch electrodes are arranged around a preset reference point, and each of the touch electrodes receives a touch signal at an edge portion far away from the preset reference point.

In the touch substrate provided by the embodiments of the present disclosure, because the positions where the touch electrodes in the touch layer are electrically connected with the touch signal lines, such as the positions where the via holes are disposed, are located in the edge area of the touch substrate, and for example, are located in the frame area, i.e., the non-display area, of the touch device including the touch substrate, the arrangement of the via holes will not affect the pixel aperture ratio of the display area of the touch device, thereby improving the uniformity of the display luminance of the touch device and further improving the display effect.

The following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A touch substrate, comprising: an underlying substrate and a touch layer,
wherein the touch layer is on the underlying substrate;
the touch layer comprises a plurality of touch electrodes which are electrically separated from each other, the plurality of touch electrodes are annularly arranged around a preset reference point, the plurality of touch electrodes are uniformly arranged in a circular ring and centered on the preset reference point, and each of the touch electrodes overlaps with an edge area of the touch substrate in a direction perpendicular to the underlying substrate;

each of the touch electrodes is electrically connected with a touch signal line on the underlying substrate in the edge area;

the preset reference point is away from a center position of the touch substrate, and the plurality of touch electrodes are identical in area; and a distance between the preset reference point and each of the touch electrodes is identical to each other.

2. The touch substrate according to claim 1, wherein at least an edge of each of the touch electrodes is in the edge area of the touch substrate.

3. The touch substrate according to claim 1, wherein each of the touch electrodes is connected to the touch signal line on the underlying substrate through a via hole in the edge area.

4. The touch substrate according to claim 1, wherein the plurality of touch electrodes are separated according to separator lines, and each of the separator lines extends from the preset reference point on the touch layer to the edge area.

5. The touch substrate according to claim 1, wherein a maximum width of each of the touch electrodes is less than or equal to an average finger width.

6. The touch substrate according to claim 1, wherein a material of the touch layer comprises a metal with a low work function or a metal alloy with a low work function.

7. The touch substrate according to claim 1, further comprising a first electrode layer, a pixel definition layer, and an organic light-emitting layer, wherein the first electrode layer and the pixel definition layer comprise patterns on the underlying substrate, the organic light-emitting layer is on a side, away from the underlying substrate, of the first electrode layer and the pixel definition layer, and the touch layer is on a side, away from the underlying substrate, of the organic light-emitting layer.

8. The touch substrate according to claim 7, wherein the touch layer is further configured to be a second electrode layer corresponding to the first electrode layer.

9. The touch substrate according to claim 8, wherein the first electrode layer is an anode layer, and the second electrode layer is a cathode layer.

10. The touch substrate according to claim 7, further comprising a plurality of spacers, wherein the plurality of spacers are between the pixel definition layer and the organic light-emitting layer, orthographic projections of the plurality of spacers on the underlying substrate overlap with orthographic projections of gaps between the plurality of touch electrodes on the underlying substrate, and the plurality of touch electrodes are separated by the plurality of spacers.

11. The touch substrate according to claim 10, wherein a cross section of each of the spacers in a direction perpendicular to an extending direction of each of the gaps between the touch electrodes is an inverted trapezoid.

12. A driving method of the touch substrate according to claim 1, comprising:

inputting a touch signal to the touch layer of the touch substrate in a touch phase, and inputting a display signal to the touch layer in a display phase.

13. The touch substrate according to claim 1, wherein the plurality of touch electrodes do not cover the center of the touch layer.

14. The touch substrate according to claim 1, wherein the preset reference point is determined based on a method of dividing functional areas of the touch substrate.

* * * * *